United States Patent [19]
Tanaka

[11] Patent Number: 5,824,951
[45] Date of Patent: Oct. 20, 1998

[54] ELECTRONIC PART COMPRISING A CASING WITH A NARROW GROOVE FORMED IN THE CASING

[75] Inventor: Yasuhiro Tanaka, Matsumoto, Japan

[73] Assignee: Murata Manufacturing Co., Ltd., Japan

[21] Appl. No.: 680,627

[22] Filed: Jul. 17, 1996

[30]     Foreign Application Priority Data

Jul. 17, 1995   [JP]   Japan ................................... 7-180227

[51] Int. Cl.⁶ .................................................. H01L 23/02
[52] U.S. Cl. ......................... 174/52.4; 361/728; 310/348
[58] Field of Search ............................. 310/89, 348, 341; 174/52.4, 52.1; 361/728, 730; 220/367.1

[56]            References Cited

U.S. PATENT DOCUMENTS 5,455,386   10/1995   Brathwaite et al. .................... 174/52.4
5,598,133   1/1997   Fuse ........................................ 333/189

Primary Examiner—Kristine L. Kincaid
Assistant Examiner—Kristina Soderquist
Attorney, Agent, or Firm—Ostrolenk, Faber, Gerb & Soffen, LLP

[57]             ABSTRACT

The invention provides an electronic part which includes a casing having a recessed portion which is free of accumulation of moisture and gases and in which a piezoelectric element and terminals are received, and a lid sealably covering the recessed portion. The casing and the lid are respectively provided with narrow grooves communicating with the recessed portion. The casing and the lid are welded together by a ultrasonic welding method at their peripheral edges with the exception of the narrow grooves and portions outside thereof, thereby forming a very narrow gap between the casing and the lid.

24 Claims, 4 Drawing Sheets

ELECTRONIC PART COMPRISING A CASING WITH A NARROW GROOVE FORMED IN THE CASING

BACKGROUND OF THE INVENTION

1. Field of the Invention

The present invention relates to an electronic part comprising a casing, and more particularly to a casing for a piezoelectric element such as a ceramic resonator, oscillator, or ladder-filter.

2. Description of Related Art

FIG. 7 shows a known ceramic oscillator. This type of oscillator is fabricated by placing a ceramic oscillation element 5 and terminals 6, 7 into a recessed portion 2 of a casing 1 and by covering the recessed portion 2 with a lid 8. The casing 1 and the lid 8 are welded or bonded together at their joining portions (peripheral edges) by bonding or by ultrasonic welding. Terminal lead-out grooves 3, 3 are sealed with a resin material.

The above-mentioned oscillator has the disadvantage that since the recessed portion 2 of the oscillator is completely sealed, the element 5 can become deteriorated or the insulating property thereof can be impaired due to the moisture confined in the recessed portion or due to a gas generated therein. Further, it also has the disadvantage that a gas within the recessed portion can expand at the time of mounting the element 5 (by soldering) so that the casing 1 cracks.

An object of the present invention is to provide an electronic part having a recessed portion sealed by a lid in such a way as to prevent the accumulation of moisture or gases therein.

To achieve the above-described object, the electronic part according to a disclosed embodiment of the present invention a casing with at least one narrow groove communicating with the recessed portion of the casing, formed in either the opening edge of the recessed portion or the peripheral edge of the lid, or both, and the casing and the lid are bonded or welded together with the exception of the narrow groove and a portion outside the narrow groove.

Both an electronic part element and its terminals are placed in the recessed portion of the casing. The recessed portion is covered by the lid bonded or welded thereto with a bonding agent or by an ultrasonic welding method. At least one of the opening edge of the recessed portion of the casing and the peripheral section of the lid has a narrow groove communicating with the recessed portion. The portion where the narrow groove is formed is not bonded or welded. Also, the portions of the casing and lid outside the narrow groove (that is, the opposing sides thereof, adjacent to the narrow groove) are not bonded or welded, so that the outside portion forms a very narrow gap at the joint of the casing and the lid. That is, the recessed portion which is sealed by the lid communicates with the atmosphere through the narrow groove and the very narrow gap. Accordingly, the gap functions to prevent the entry of foreign matter from outside and to discharge any inside moisture and gases into the atmosphere.

According to the present invention, since the recessed portion that receives an electronic part element and its terminals is in communication with the atmosphere through the narrow groove and the very narrow gap, neither moisture nor gases accumulate therein, the electronic element is not damaged, the insulation property thereof is not impaired, and the casing does not crack due to the thermal expansion of the gas within the recessed portion. As a result, the present invention provides a highly reliable electronic part.

DESCRIPTION OF THE PREFERRED EMBODIMENT

A preferred embodiment of the present invention will now be described below by referring to the accompanying drawings.

Figure 1:
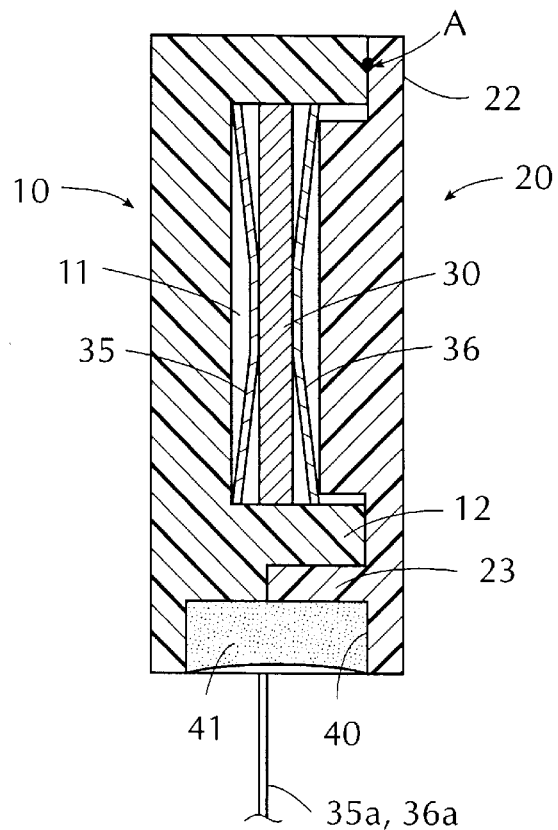
FIG. 1 is a sectional view of the central portion of a ceramic oscillator according to one embodiment of the present invention.

FIG. 1 is a sectional view of the central portion of a ceramic oscillator according to one embodiment of the present invention. The oscillator comprises a casing 10, a lid 20, a piezoelectric element 30, and terminals 35, 36.

Figure 2:
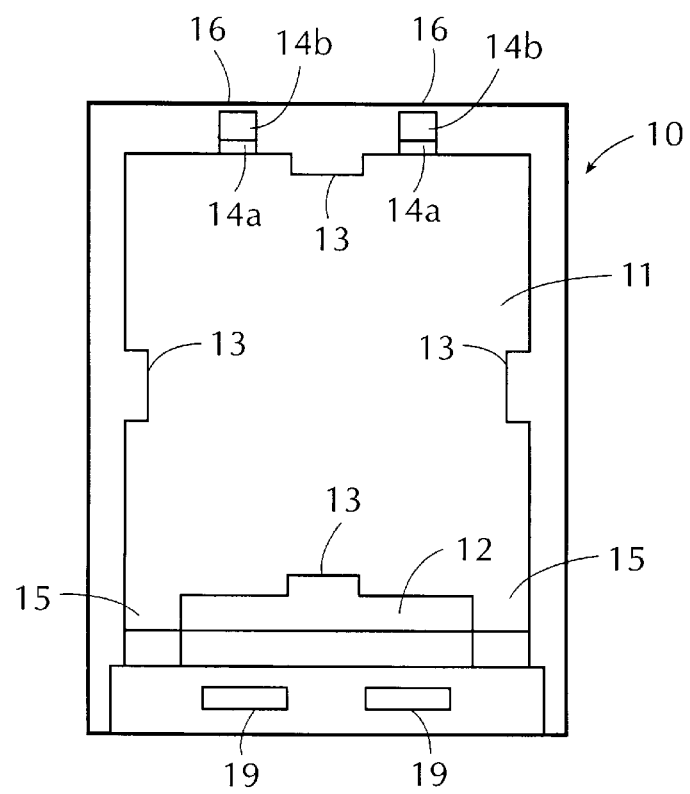
FIG. 2 is a front view of a casing forming the ceramic oscillator of FIG. 1.
Figure 3:
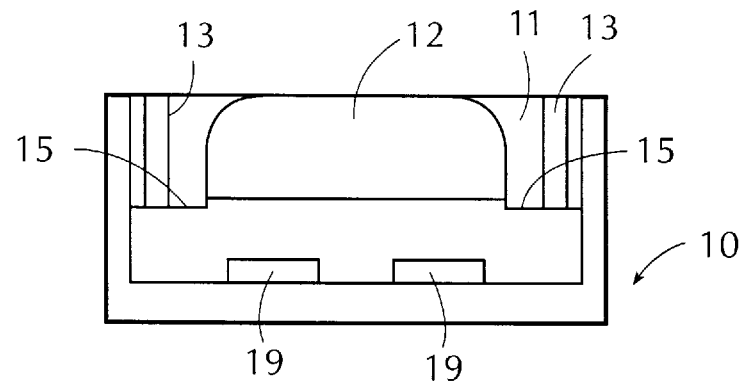
FIG. 3 is a bottom view of the casing of FIG. 1.
Figure 4:
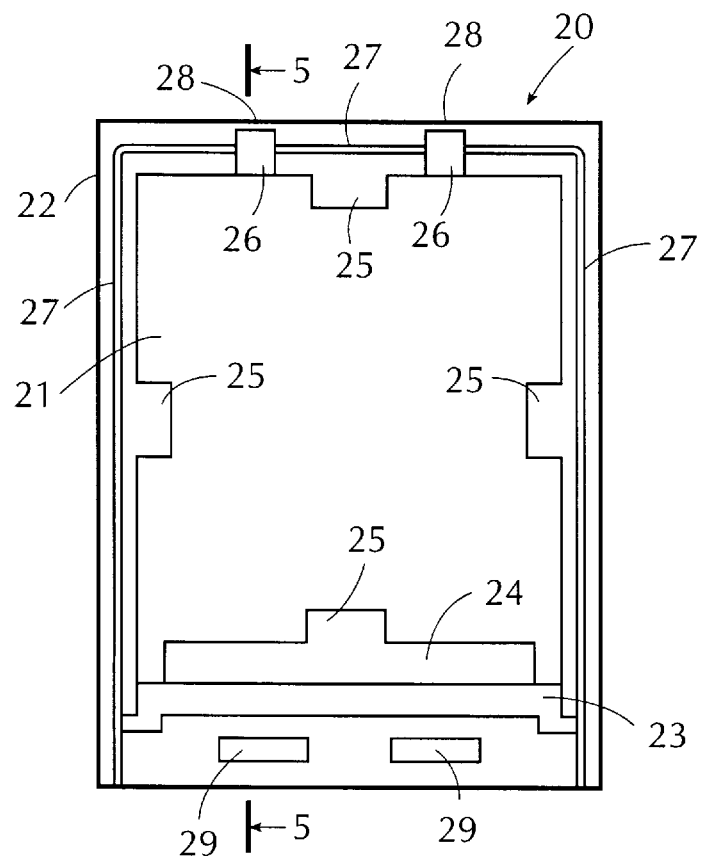
FIG. 4 is a front view of a lid forming the ceramic oscillator of FIG. 1.
Figure 5:
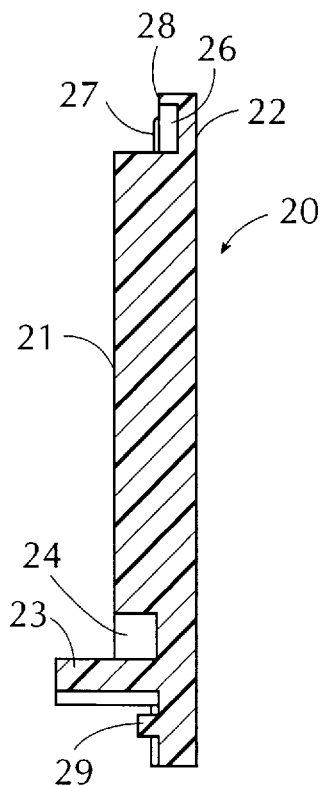
FIG. 5 is a cross sectional view taken along line V—V in FIG. 4.

The casing 10 is made of a resin, and as shown in FIGS. 2 and 3, it has a recessed portion 11 and a bottom partition 12. The inner wall of the recessed portion 11 has protrusions 13, 13 for positioning the piezoelectric element 30. The upper wall of the casing 10 has narrow grooves 14a, 14b. The lid 20 is made of the same resin material as that of the casing 10. As shown in FIGS. 4 and 5, the lid 20 has a thick section 21, a thin peripheral section 22, and a bottom partition 23, and forms concavities 24, 25 to receive the bottom partition 12 and the protrusions 13, 13 of the casing 10, respectively, when the casing 10 and the lid 20 are assembled. At the peripheral section 22 of the lid 20, there are formed narrow grooves 26, 26, at positions facing the narrow grooves 14a, 14b. In addition, a small rib 27 is formed around the peripheral section 22. The small rib 27 is discontinued at the positions at which the narrow grooves 26, 26 are formed.

To describe the procedure of assembling the oscillator, the terminal 35, the piezoelectric element 30, and the terminal 36 are successively placed into the recessed portion 11 of the casing 10. In this case, external connecting portions 35a, 36a of the terminals 35, 36 are extended outside through spaces 15, 15 alongside the partition 12, respectively. Then, the lid 20 is placed in the recessed portion 11 of the casing 10. The lid 20 is connected to the casing 10 together by fitting the thick portion 21 thereof into the recessed portion 11.

Next, ultrasonic radiation is used to heat the peripheral section 22 of the lid 20 to fuse the rib 27. Thus the casing 10 and the lid 20 are welded to become integral with each other. The portion indicated by the arrow A in FIG. 1 is the welded portion. Then, a lower recessed portion 40 (refer to FIG. 1) formed by the casing 10 and by the lid 20 is filled with a sealing resin 41 to seal the bottom. Small protrusions 19, 29 formed in the lower recessed portion 40 are for preventing the sealing resin 41 from leaking out.

Figure 6:
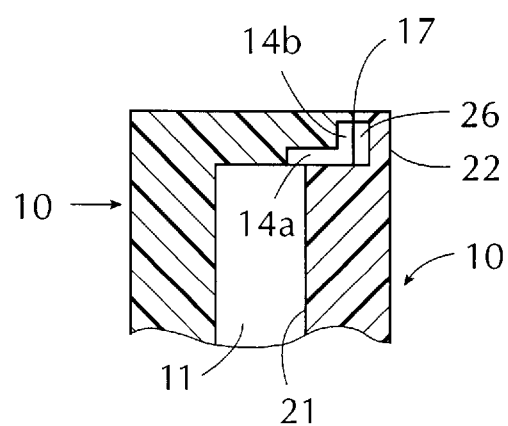
FIG. 6 is an enlarged cross sectional view corresponding to an upper portion of FIG. 1, which illustrates how the casing and the lid are connected together.
Figure 7:
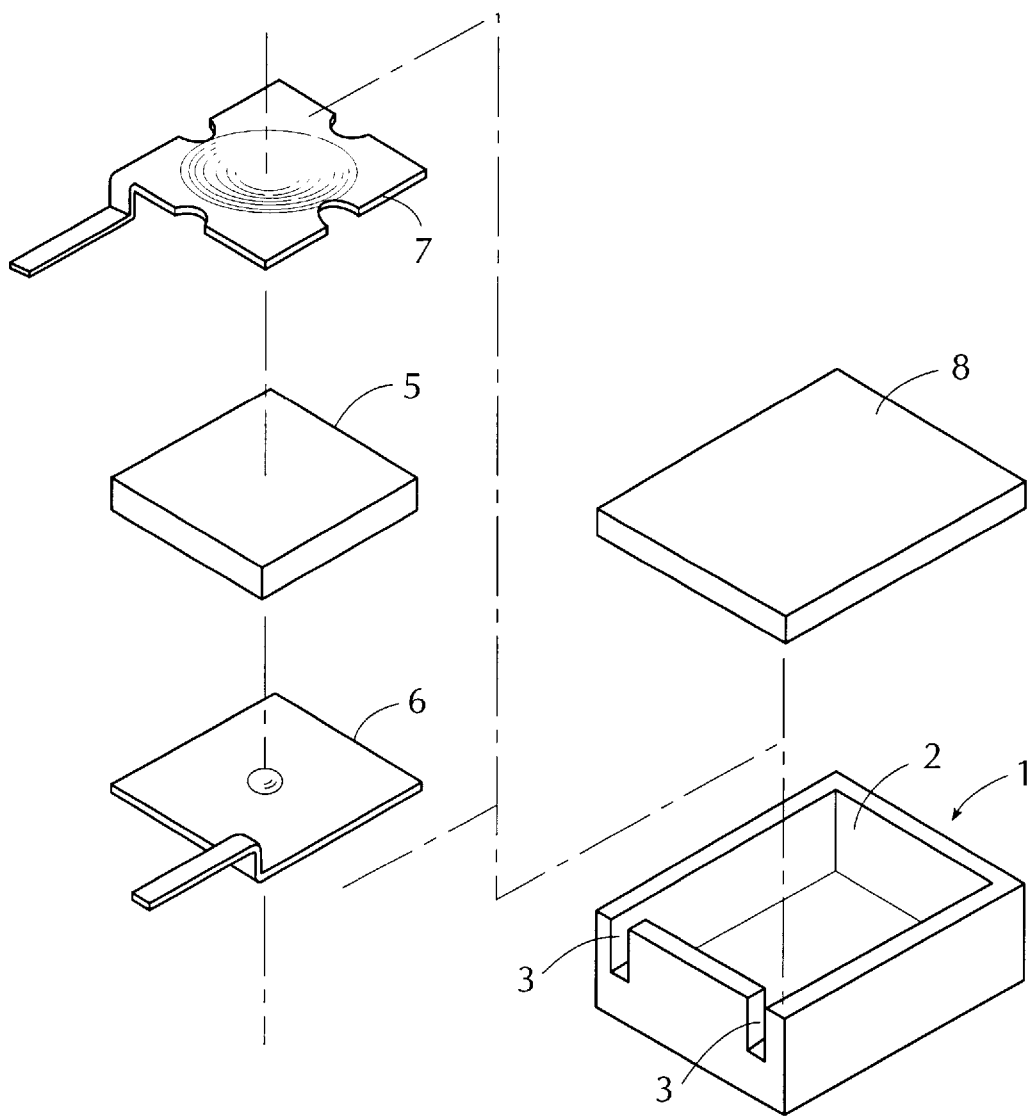
FIG. 7 is an exploded perspective view of a conventional ceramic oscillator.

In the oscillator thus assembled, the recessed portion 11 between the casing 10 and the lid 20 is sealed through the fusion of the rib 27 and the filling of the sealing resin 41 into the lower recessed portion 40. However, the narrow grooves 14a, 14b, 26 and the respective portions 16, 28 of the casing 10 and lid 20 that contact each other outside the grooves are not welded. The recessed portion 11 communicates with the atmosphere through a very narrow gap 17 (refer to FIG. 6) which is formed by the narrow grooves 14a, 14b, 26 and the contact portions 16, 28. As a result, moisture and gases inside the recessed portion 11 are dissipated outside through the narrow grooves 14a, 14b, 26 and the gap 17.

Both the width and the depth of the narrow grooves should be at least about 0.1 mm. If the narrow grooves are smaller than that size, they may become filled with resin material, thereby not performing the objectives of the present invention. The narrow grooves should not be so large that they reduce the strength of the case and permit the case to be easily deformed. Further, the number of grooves should not be so great that the metal mold for manufacturing the case becomes complicated, which would increase the cost of production.

The minimum size for the gaps is believed to be about 1 $\mu$m in each dimension, but it facilitates mass production if the gaps are at least about 0.1 mm in each dimension.

In one example of the invention, two narrow grooves whose width was 0.5 mm and whose depth was 0.3 mm were provided in a case having a circumference of about 25 mm. The case contained about $1 \times 10^{-4}$ g/cc of aqueous vapor at 20 degrees C. The minimum size of the gaps for venting the case would be about 1 $\mu$m, and in this example their size is about 0.1 mm.

The electronic parts of the present invention are not limited to the above-described embodiment but various changes and modifications thereto can be made without departing from the spirit and scope of the invention.

In particular, the casing 10 and the lid 20 may be jointed together by an adhesive instead of welding. In that case, the adhesive is applied to the portion where the rib 27 is formed. Further, the narrow groove for establishing communication with the atmosphere may be formed on either one of the casing 10 and the lid 20, and the number of narrow grooves may be 1 or more.

The present invention is applicable to a wide range of electronic parts, in addition to piezoelectric parts.

What is claimed is:

1. An electronic part comprising a casing having a recessed portion therein surrounded by a wall of the casing, an electronic element and terminals housed within the recessed portion of the casing and a lid covering the recessed portion, the lid having a peripheral section which engages with the wall of the casing, wherein:
   at least one narrow groove communicating with the recessed portion is formed extending partially but not completely through at least one of the wall of the casing and the peripheral section of the lid; and
   the casing and the lid are sealed together with the exception of the narrow groove and portions of the casing and lid adjacent to the narrow groove.

2. The electronic part of claim 1, wherein said lid has a thick central section, a thin peripheral section and a bottom partition.

3. The electronic part of claim 1, wherein said recessed portion has protrusions for defining a position for said electronic element.

4. The electronic part of claim 1, wherein said narrow groove is configured to prevent entry of foreign matter into the recessed portion and to permit discharge of moisture and gases out of the recessed portion.

5. An electronic part comprising a casing having a recessed portion therein surrounded by a wall of the casing, an electronic element and terminals housed within the recessed portion of the casing and a lid covering the recessed portion, the lid having a peripheral section which engages with the wall of the casing, wherein:
   at least one narrow groove communicating with the recessed portion is formed in at least one of the wall of the casing and the peripheral section of the lid; and
   the casing and the lid are sealed together with the exception of the narrow groove and portions of the casing and lid adjacent to the groove;
   wherein said recessed portion has protrusions for defining a position for said electronic element; and
   wherein said lid has concavities aligned to receive said protrusions.

6. The electronic part of claim 5, wherein said casing has a bottom partition and said lid has a further concavity aligned to receive said bottom partition of said casing.

7. The electronic part of claim 6, wherein said bottom partition of said casing is spaced away from said wall of said casing and from said peripheral portion of said lid.

8. An electronic part comprising a casing having a recessed portion therein surrounded by a wall of the casing, an electronic element and terminals housed within the recessed portion of the casing and a lid covering the casing, the lid having a peripheral section which engages with the wall of the casing, wherein
   at least one narrow groove which communicates with the recessed portion of the casing is formed in the wall of the casing and a second narrow groove is formed in the peripheral section of the lid at a position facing the narrow groove of the casing; and
   the casing and the lid are adhered together at the peripheral section of the lid with the exception of the portion where the narrow grooves are formed.

9. The electronic part of claim 8, wherein a rib is formed between the casing and the lid, and an adhesive is applied in the vicinity of the rib.

10. The electronic part of claim 8, wherein the lid has a thick central section, a thin peripheral section and a bottom partition.

11. The electronic part of claim 10, wherein said casing has a concavity for receiving said bottom partition of said lid.

12. The electronic part of claim 11, wherein said bottom partition of said lid is spaced away from said wall of said casing and from said peripheral portion of said lid.

13. The electronic part of claim 8, wherein the recessed portion has protrusions for defining a position for the electronic element.

14. The electronic part of claim 13, wherein the lid has concavities aligned to receive the protrusions.

15. The electronic part of claim 14, wherein said casing has a bottom partition and said lid has a further concavity aligned to receive said bottom partition of said casing.

16. The electronic part of claim 15, wherein said bottom partition of said casing is spaced away from said wall of said casing and from said peripheral portion of said lid.

17. The electronic part of claim 8, wherein the casing and the lid are adhered together by an adhesive.

18. The electronic part of claim 8, wherein the casing and the lid are adhered together by a fused portion of at least one of the casing and the lid.

19. The electronic part of claim 18, wherein said fused portion is formed by ultrasonic welding.

20. The electronic part of claim 8, wherein said narrow grooves are configured to prevent entry of foreign matter into the recessed portion and to permit discharge of moisture and gases out of the recessed portion.

21. The electronic part of claim 8, wherein said casing has a bottom partition and said lid has a concavity aligned to receive said bottom partition of said casing.

22. The electronic part of claim 21, wherein said bottom partition of said casing is spaced away from said wall of said casing and from said peripheral portion of said lid.

23. An electronic part comprising a casing having a recessed portion therein surrounded by a wall of the casing, an electronic element and terminals housed within the recessed portion of the casing and a lid covering the recessed portion, the lid having a peripheral section which engages with the wall of the casing, wherein:

at least one narrow groove communicating with the recessed portion is formed in at least one of the wall of the casing and the peripheral section of the lid; and the casing and the lid are sealed together with the exception of the narrow groove and portions of the casing and lid adjacent to the narrow groove;

wherein said casing has a bottom partition and said lid has a concavity aligned to receive said bottom partition of said casing; and wherein said bottom partition of said casing is spaced away from said wall of said casing and from said peripheral portion of said lid.

24. An electronic part comprising a casing having a recessed portion therein surrounded by a wall of the casing, an electronic element and terminals housed within the recessed portion of the casing and a lid covering the recessed portion, the lid having a peripheral section which engages with the wall of the casing, wherein:

at least one narrow groove communicating with the recessed portion is formed in at least one of the wall of the casing and the peripheral section of the lid; and the casing and the lid are sealed together with the exception of the narrow groove and portions of the casing and lid adjacent to the narrow groove;

wherein said lid has a thick central section, a thin peripheral section and a bottom partition;

wherein said casing has a concavity for receiving said bottom partition of said lid; and wherein said bottom partition of said lid is spaced away from said wall of said casing and from said peripheral portion of said lid.

* * * * *